United States Patent [19]
Brady et al.

[11] Patent Number: 5,826,328
[45] Date of Patent: Oct. 27, 1998

[54] METHOD OF MAKING A THIN RADIO FREQUENCY TRANSPONDER

[75] Inventors: Michael J. Brady, Brewster; Pedro A. Chalco, Yorktown Heights, both of N.Y.; Francois Guindon, Stukely sud Qc, Canada; Paul Andrew Moskowitz, Yorktown Heights, N.Y.; Philip Murphy, New Fairfield, Conn.

[73] Assignee: International Business Machines, Armonk, N.Y.

[21] Appl. No.: 621,385

[22] Filed: Mar. 25, 1996

[51] Int. Cl.$^6$ ................................................... H01R 43/00
[52] U.S. Cl. .............................. 29/827; 29/600; 29/601; 340/572; 343/806; 343/845
[58] Field of Search .............................. 29/846, 600, 601, 29/411, 412; 343/806, 845; 340/572

[56] References Cited

U.S. PATENT DOCUMENTS

| | | | |
|---|---|---|---|
| 4,796,080 | 1/1989 | Phy | 257/671 |
| 4,852,250 | 8/1989 | Andrews | 29/827 |
| 5,347,709 | 9/1994 | Maejoma et al. | 29/827 |
| 5,387,443 | 2/1995 | Heller et al. | 340/572 |
| 5,471,097 | 11/1995 | Shibata | 361/813 |
| 5,528,222 | 6/1996 | Moskowitz et al. | 340/572 |
| 5,566,441 | 10/1996 | Marsh et al. | 29/600 |

*Primary Examiner*—Carl J. Arbes
*Attorney, Agent, or Firm*—Louis J. Percello; Ronald L. Drumheller

[57] ABSTRACT

Manufacturing of a novel thin and flexible radio frequency (RF) tag with a stamped metal leadframe antenna is disclosed. The tag is made by transporting a leadframe strip having leadframe antenna "cutouts" to a point where a chip is mechanically and electrically attached directly to the leadframe antenna. A battery can be attached to the chip in the process. Processes to cut support bars holding the leadframe antenna to the leadframe strip, seal the package (by lamination or molding), and to excise the sealed component are performed in various orders to produce a final product. Intermediate support (positioners) for the thin leadframe are optionally provided add structural support to the antenna while the sealed component is made. A protective surround can be added to cover the package and to provide further structural support for the package while still permitting the sealed component to be thin and flexible.

27 Claims, 11 Drawing Sheets

METHOD OF MAKING A THIN RADIO FREQUENCY TRANSPONDER

FIELD OF THE INVENTION

This invention relates to a method of manufacturing a radio frequency circuit in a thin flexible package. More specifically, the invention relates to making a thin leadframe antenna and radio frequency circuit used as a radio frequency tag.

BACKGROUND OF THE INVENTION

The prior art connects integrated circuit chips (chip) to thin metallic foils, e.g., leadframes. In these methods, the chip is affixed on top of the leadframe, then the leadframe is connected to electrical connections on the chip by wire bonding techniques. Because of the fragile nature of the bonding, the connections are encapsulated for support.

The types of bonding generally employed are ultrasonic, thermosonic, or thermocompression wire bonding. A thin gold or aluminum wire is bonded by one of the techniques to a foil leadframe.

Typically leadframes are connecting and supporting elements to provide connections between the chip contacts and other electrical connections. Therefore, they normally have a thickness of 150 to 200 microns to provide some rigidity.

PROBLEMS WITH THE PRIOR ART

The prior art methods have difficulty in producing transponders that are thin and flexible, particularly if the transponders have a leadframe structure. This is because the prior art leadframe structures require that the chip be attached to the surface of the leadframe (adding to the thickness of the chip and leadframe to the package), use the leadframe as an intermediate connection which tends to add additional layers and thickness to the package), and require wire bonding (which also adds to the package thickness because or the "loop height" of the wire bond.) Further, the leadframe used in the prior art has to be of a minimum thickness to provide support and rigidity to the package.

OBJECTS OF THE INVENTION

An object of this invention is an improved method of manufacturing a thin radio frequency transponder.

An object of this invention is an improved method of manufacturing a thin radio frequency transponder with a leadframe antenna.

An object of the invention is a method of making a flexible radio frequency tag apparatus with a thin flexible protective lamination.

SUMMARY OF THE INVENTION

The present invention is a method of making thin, flexible transponders with a leadframe structure (antenna). A leadframe strip that is thin (75–100 microns), having a low thermal mass and lower thermal conductance, is used. Leadframe antennas are created as patterns in the leadframe strip and connections to the leadframe antennas are attached directly to circuit chip connections. No intermediate connection layers or wiring is required and the patterns in the leadframe strip become an integral component, the antenna, of the transponder.

The leadframe strip having leadframe antenna "cutouts" is transported to a point where a chip is mechanically and electrically attached directly to the leadframe antenna. The chip and parts of the leadframe antenna are optionally encapsulated. A battery also can be attached to the chip in the process. Depending on the embodiment, support bars holding the leadframe antenna to the leadframe strip are cut, the package is sealed (laminated or molded), and a sealed component is excised in different sequences to produce a final product. Intermediate support (positioners) for the thin leadframe are optionally provided so that the chip can be positioned at the connection end of the leadframe antenna and so that the thin leadframe antenna does not geometrically deform (short out) during the assembly process. For example, the spacing of multi-element antennas is maintained.

A protective surround can be added to cover the package and to provide added structural support for the package while still permitting the package to be thin and flexible.

Various structures made by invention are disclosed in U.S. patent application Ser. No. 08/621,184 to Brady et al. entitled "Thin Radio Frequency Transponder with Leadframe Antenna Structure" filed on the same day as this application and which is herein incorporated by reference in its entirety.

BRIEF DESCRIPTION OF THE DRAWINGS

FIG. 4, comprising

DETAILED DESCRIPTION OF THE INVENTION

Figure 1:
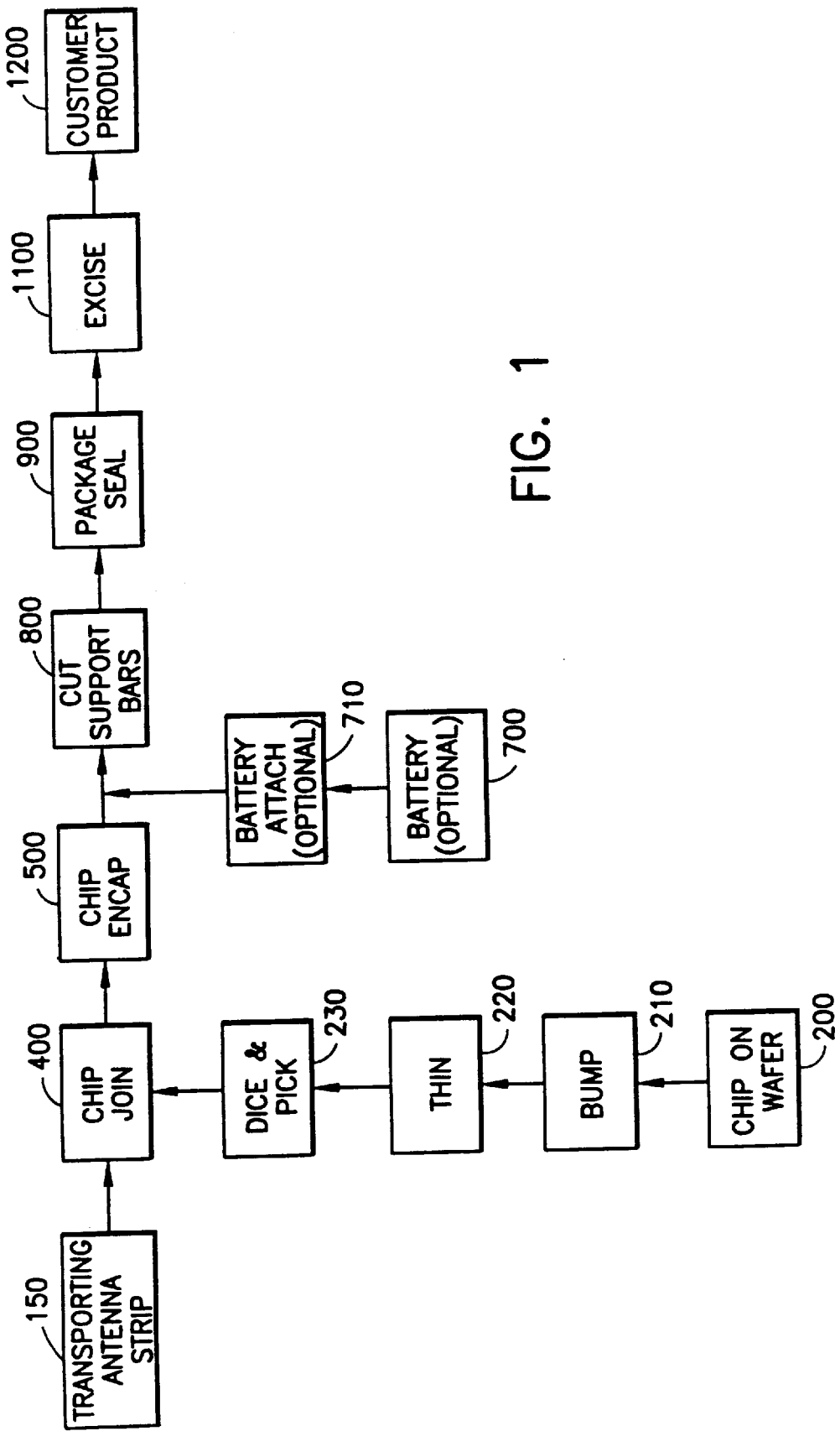
FIG. 1 is a flow diagram showing the steps of making the radio frequency tag (transponder component).

FIG. 1 is a flow diagram showing the steps in the manufacture of the radio frequency tag. In step 400, chips are joined to individual antennas on a transported 150 leadframe antenna strip 100. The chips are fabricated as integral parts of a semniconductor wafer 200, the I/Os on the chips are bumped 210, the wafer is thinned 220, and the wafer is diced and individual chips are picked 230. Steps 200, 210, 220, and 230 are well known in the semiconductor industry and are described in detail in the following: "Silicon Processing for The VLSI Era", vol. 1, by S. Wolf and R. N. Tauber, Lattice Press, Sunset Beach, Calif., 1986, ISBN 0-961672-3-7; "Backgrinding Wafers For Maximum Die Strength", by S. Lewis, in Semiconductor International July 1992, p.86; "Chip On Board Technologies For Multichip Modules", edited by John H. Lau, Van Nostrand Reinhold Publishing Company, New York, 1994, ISBN 0-442-01441-4, which are herein incorporated by reference in their entirety.

Figure 2:
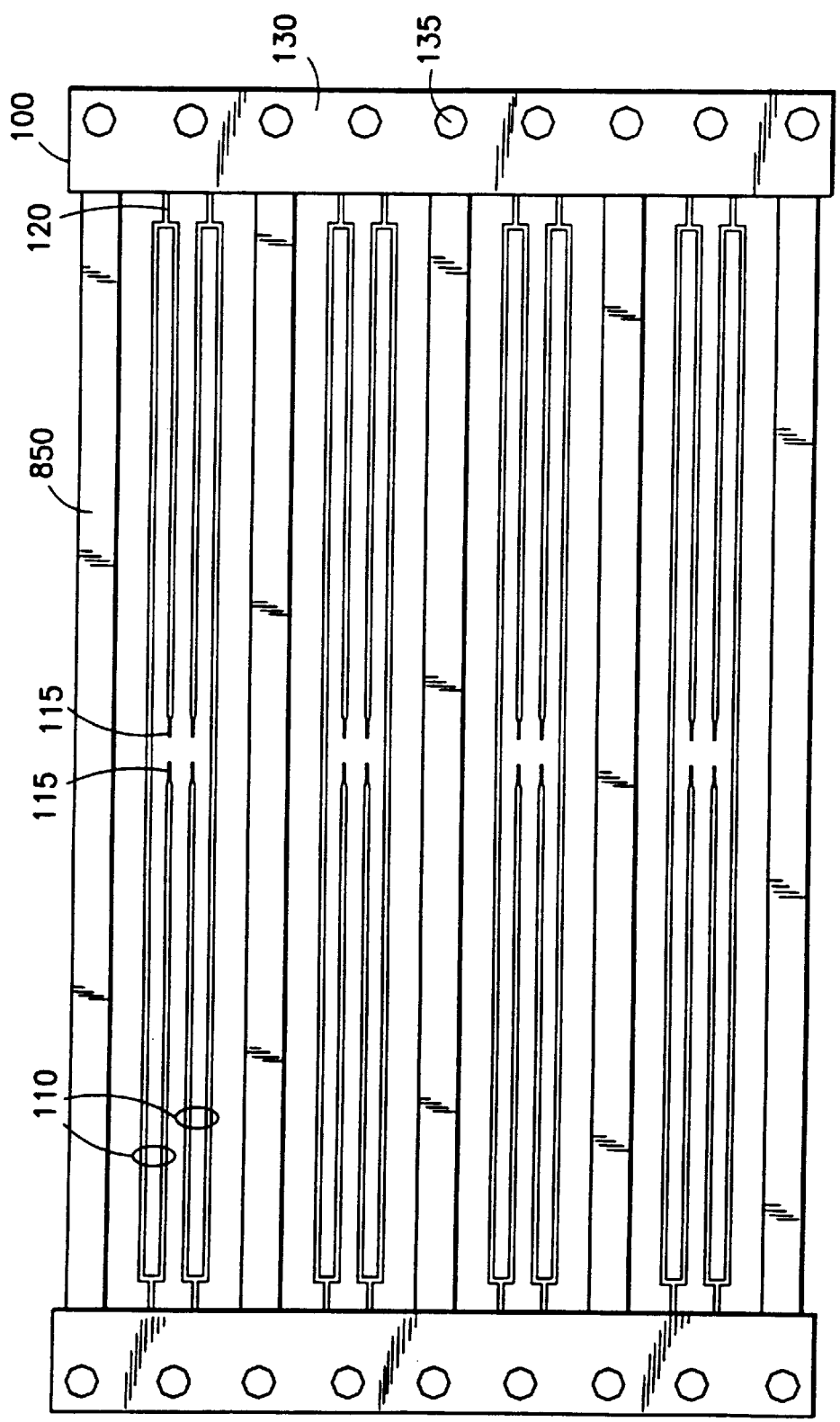
FIG. 2 is a drawing showing one preferred embodiment of a thin lead frame strip used to make thin antennas for the radio frequency tag.

A leadframe (antenna) strip 100, FIG. 2, is a thin etched or stamped foil, typically manufactured from a thin foil of copper, copper-alloy, or nickel-iron alloy by stamping or etching. The etching or stamping creates patterns on the leadframe strip 100 that become leadframe antennas 110. The leadframe strip 100 comprises a supporting frame 130 with sprocket holes 135, the individual leadframe antennas 110, support bars 120, support rails 850, and inner bonding leads 115. In a preferred embodiment, the antenna strip 100 is between 2.8 mils and 10 mils (i.e. 70 microns and 250 microns) thick. More preferably, the antenna strip is between 75 microns and 110 microns, typically 100 microns thick. The leadframe strip 100 of this thickness has a low thermal mass and lower thermal conductance which helps the circuit chip to be directly attached (see FIG. 4 below) to the leadframe strip 100.

Figure 3:
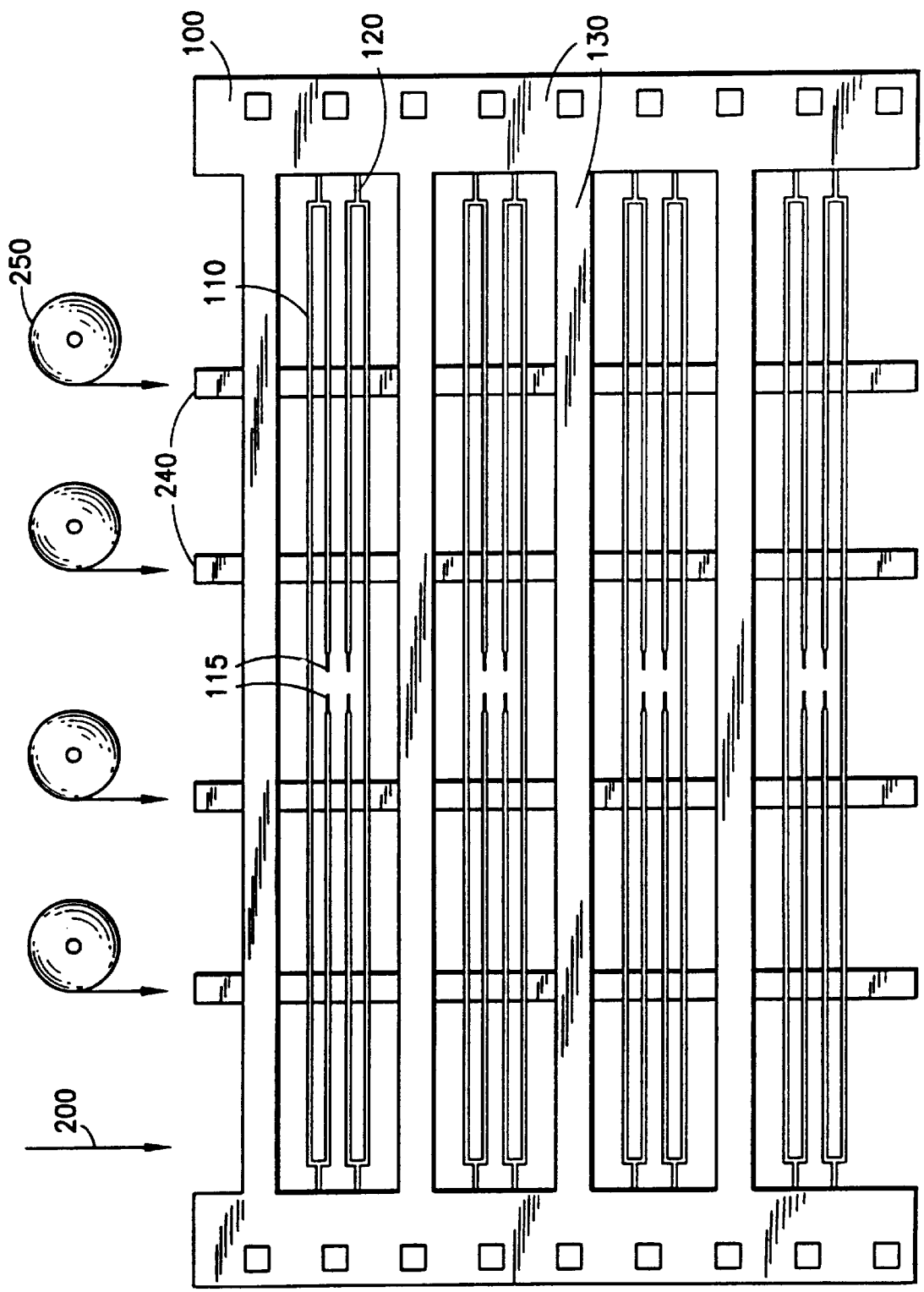
FIG. 3 is drawing showing an alternative preferred embodiment of the leadframe strip of thin antennas for the radio frequency tag.

Note that the antennas 110 shown in FIGS. 2 and 3 are loop antennas. However, the leadframe antennas 110 can be of any type, for example those disclosed in the patent application entitled "Thin Radio Frequency Transponder with Leadframe Antenna Structure" incorporated above. The type of the antenna is determined by the pattern that is produced, e.g., stamped/etched in the leadframe antenna strip 100. This method can be applied to any of these and other antenna patterns.

In a preferred embodiment, FIG. 3, the leadframe strip 100 comprises a supporting frame 130, individual antennas 110, support bars 120, support rails 850, and inner bonding leads 115, as shown in FIG. 2. The strip 100 also has positioner strips (or positioners) 240. The strip 100 is transported 200 by known means. The positioner strips 240 can be added during the manufacturing process of the strip 100 and consist of narrow, preferably 2 mm to 5 mm wide strips of polyimide or other plastic adhered to the antennas 110 and supporting frame 130 by means of adhesive such as butyral phenolic. Other adhesives that may be employed are acrylics, silicones, or modified epoxies.

The positioner 240 also can be a sheet with one or more apertures in the locations where the circuit chips are attached.

The positioner strips 240 are spooled 250 onto the leadframe strip by known methods. See "Microelectronics Packaging Handbook", edited by R. Tummala, Van Nostrand Rheinhold, New York, 1989 which is herein incorporated by reference in its entirety. Note that the positioner strips 240 are spooled 250 onto the leadframe strip 100 after the leadframe strip 100 is etched or stamped. Also the positioner strips 240, in most embodiments, support only a portion of the leadframe strip 100.

Figure 4A:
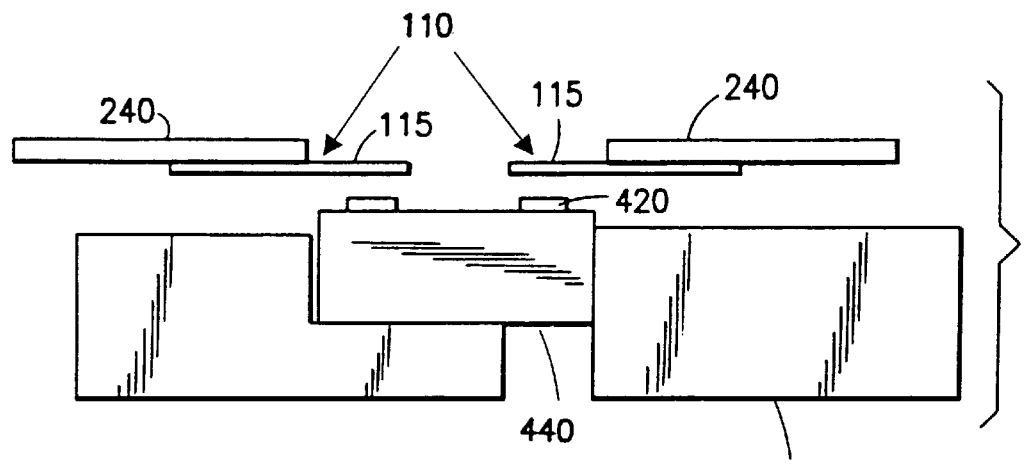
FIGS. 4a–4c, is a drawing showing a method of bonding of the circuit chip to one of the thin leadframe antennas.
Figure 4B:
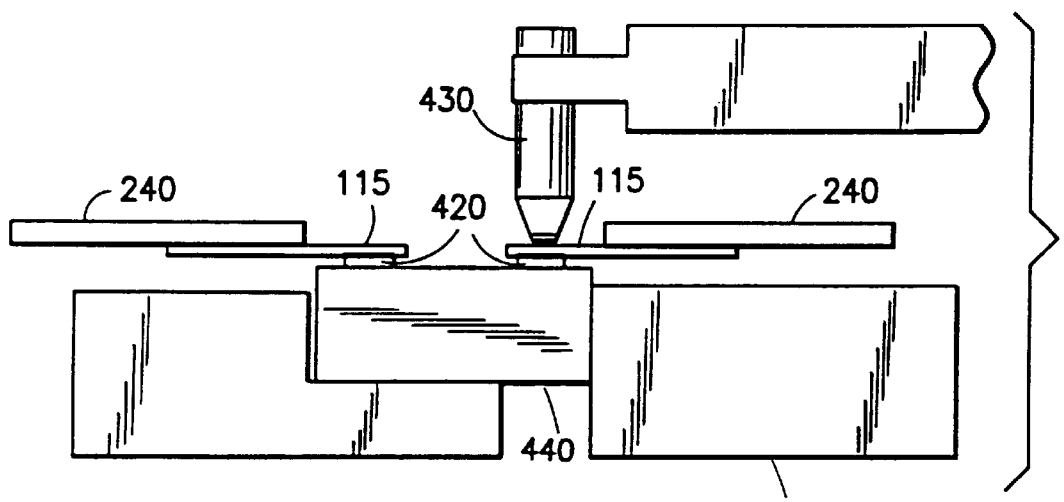
Figure 4C:
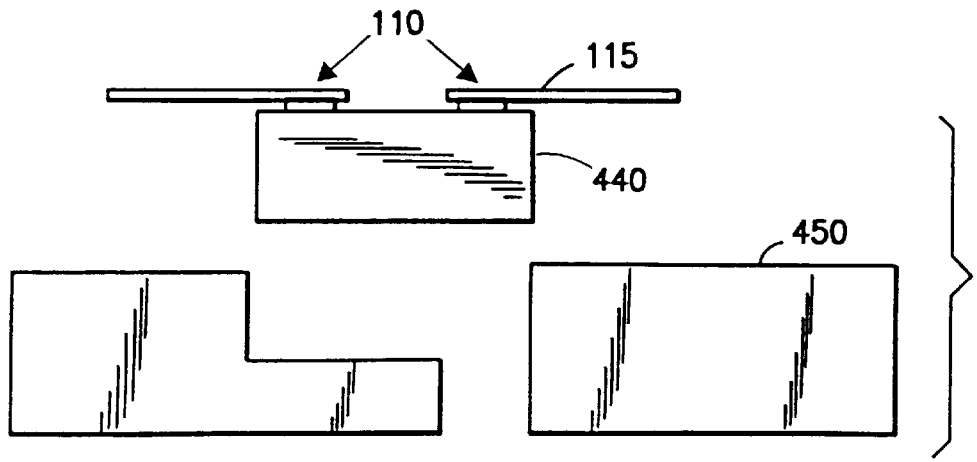

The chip bonding, step 400, shown in FIG. 4, is accomplished by first placing the individual antenna 110 in alignment with the chip 440 such that the inner bonding leads 115 of the antenna 110 are aligned to the bumps 420 on the chip 440 as shown in FIG. 4a. Next, FIG. 4b, a bonding head 430 is placed in contact with the inner lead 115 and the inner lead 115 is pressed to the bump 420. Through the application of heat and pressure, the bond is completed and the chip and antenna combination is lifted from the retention apparatus 450 as shown in FIG. 4c. Alternate methods of bonding include: thermosonic; lasersonic; soldering; and wirebonding. See U.S. Pat. No. 4,970,365, entitled "Method and Apparatus for Bonding Components Leads to Pads Located on a Non-rigid Substrate", to Chalco issued on Nov. 13, 1990 that is herein incorporated by reference in its entirety.

Figure 5A:
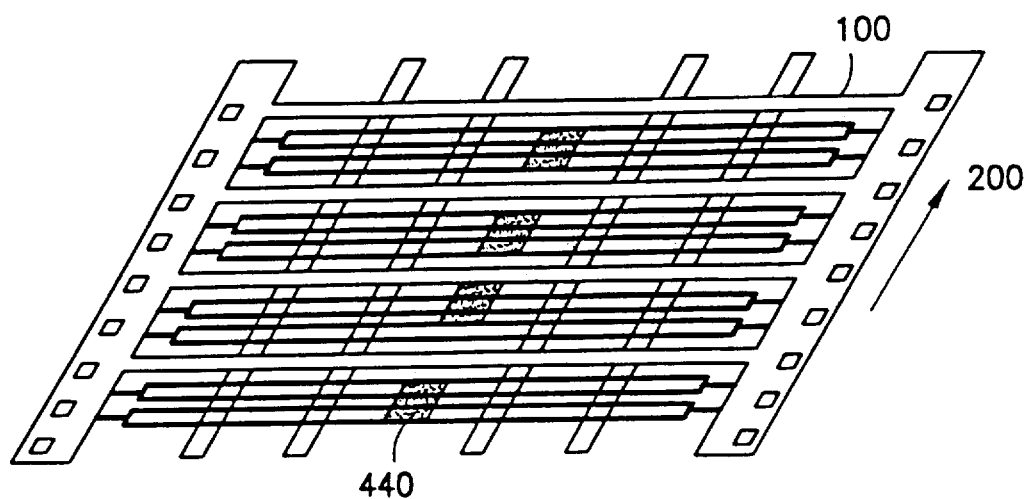
FIG. 5 is a drawing showing a preferred embodiment for the method of encapsulation (FIG. 5B) of the chip bonded (FIG. 5A) to the thin leadframe antenna(s).
Figure 5B:
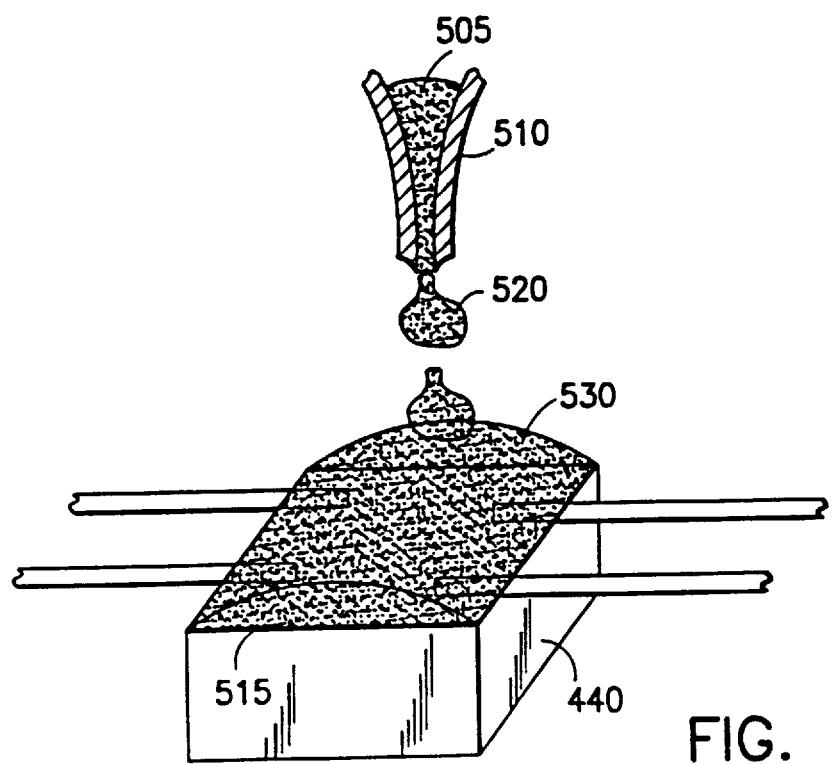

The chip encapsulation process, step 500, shown in FIG. 5, is accomplished by the application of a chip face encapsulant material (FIG. 5B) on the chips 440 that are attached to the leadframe strip 100. Typically, an epoxy 520 such as Dexter Hysol 4323 is applied. The epoxy 520 is contained within a dispenser 510 which is brought in close proximity to the chip surface 515. The epoxy 505 is dispensed in drops 520 to form a dome of encapsulant 530 over the surface of the chip 515. Curing of the epoxy is done at an elevated temperature, e.g. 150 C. for approximately 4 hours. Other chip encapsulants may be chosen from among the available modified epoxy resins manufactured by Dexter Hysol, Abelstik, and Epotek, for example encapsulants that have faster cure cycles.

Figure 6:
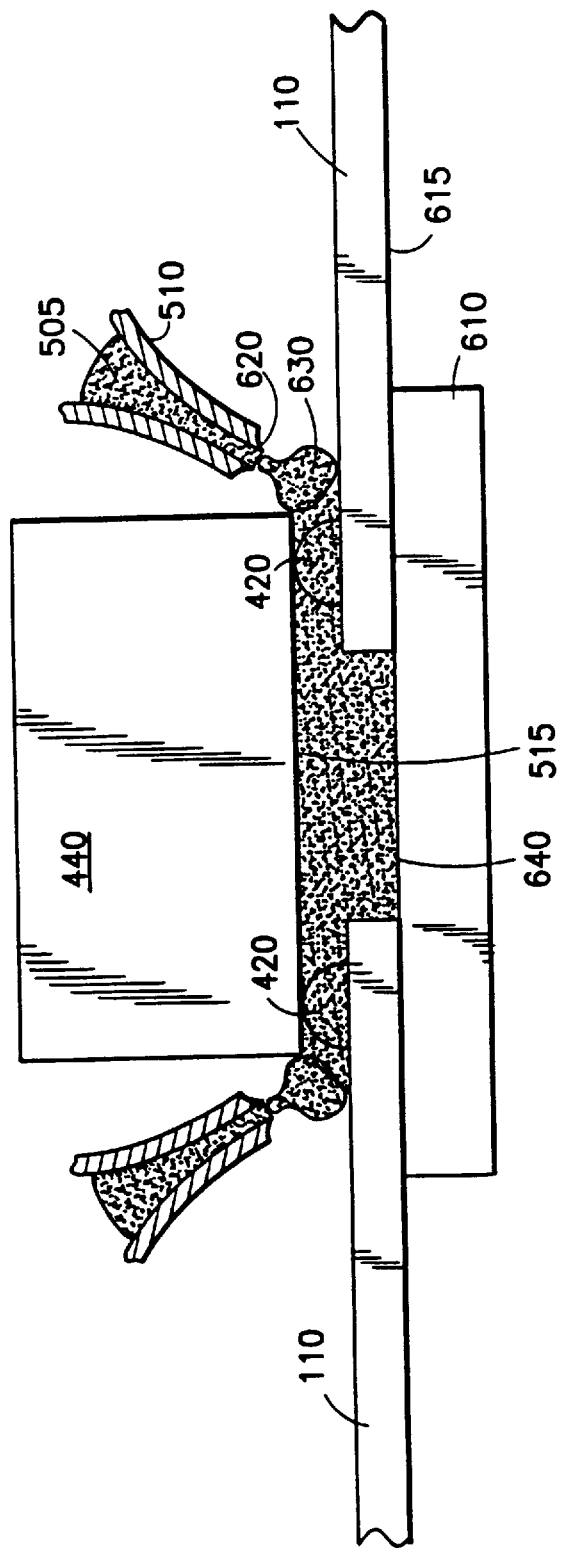
FIG. 6 is a drawing showing an alternative preferred embodiment for the method of encapsulation of the chip bonded to the thin antenna.

An alternatively preferred embodiment for the chip encapsulation, step 500, is shown in FIG. 6, and is accomplished through the addition of a novel overlayer 610 to the surface of the leadframe 615. The overlayer 610 is a polyimide or other suitable polymer. The space 640 between the overlayer 610 and the chip 440 is filled by the capillary action of the encapsulant material 505. The nozzle 620 of the dispenser 510 is placed adjacent to the space 640. The encapsulant material 505 then flows into and fills the space 640. Curing of the encapsulant is done at an elevated temperature, e.g. 150 C. for 4 hours for Hysol 4511. Other suitable encapsulants are manufactured by the companies mentioned above. Note that in FIG. 6, the chip is shown on top of the leadframe antenna 110 while in FIG. 5A the chip is shown below the leadframe antenna.

In a preferred embodiment, the overlayer 610 has a size and a position so that the overlayer extends past the edges of the chip, i.e., is positioned at least over the entire chip surface 515. The overlayer 610 forms a "dam" which produces a capillary action when the encapsulation material is dispensed so that the encapsulation material reflows over the entire chip surface 515. After the encapsulation material cures, the encapsulant provides a mechanical connection that connects the leadframe antenna 110 to the chip surface 515 and bumps 420. This mechanical connection provides support for the antenna 110 bonding leads 115, chip surface 515, and bumps 420 while allowing the antenna 110 and bonding leads 115 to flex without breaking. The cured encapsulant also provides environmental protection for the chip surface against mechanical and chemical damage.

The embodiment shown in FIG. 6 uses a structure that has the leadframe antenna 110 "sandwiched" between the overlayer 610 and the chip 440. This is done (see FIG. 5A) by using a cutting tool 580 that cuts 582 the overlayer 610 from a strip of polymer tape 585 and places 587 the overlayer 610 on the leadframe antenna 110 in a position over the chip 440 surface 515.

Figure 7:
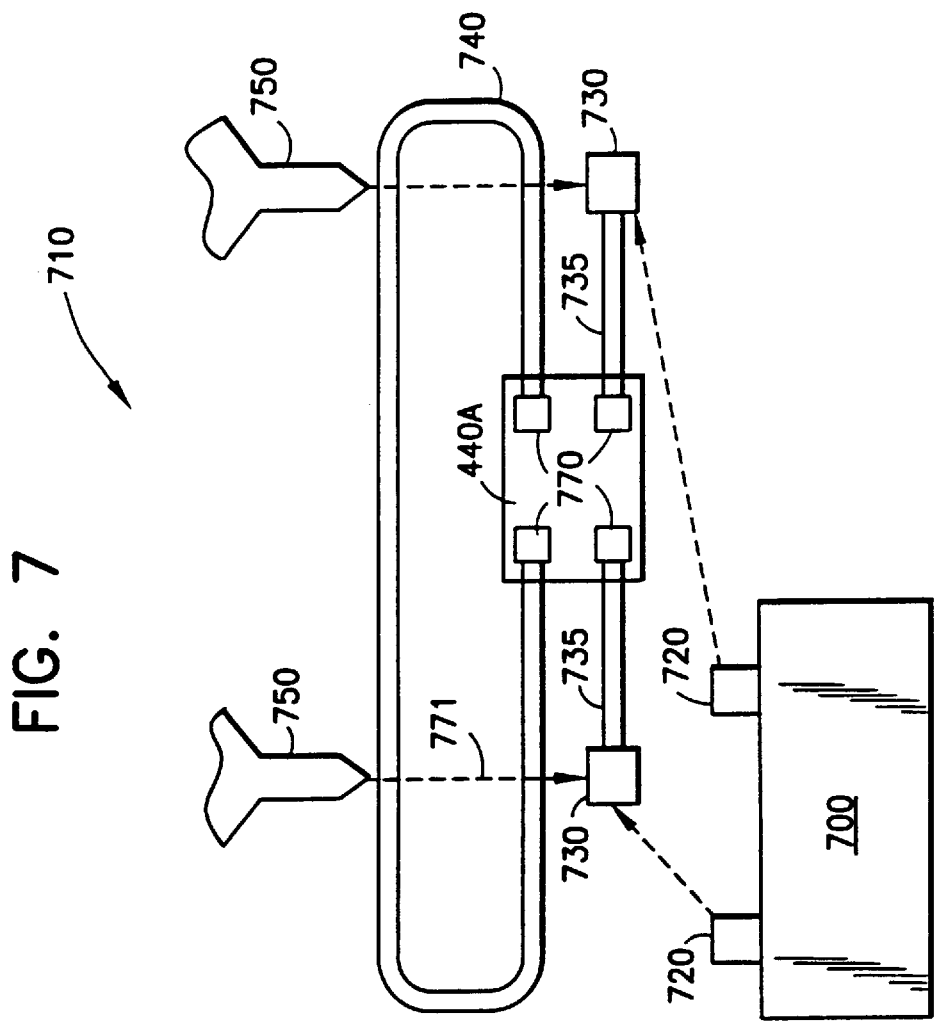
FIG. 7 is a drawing showing a method for the attachment of a battery to the thin leadframe structure.

Optionally, a battery may be attached 710 to the leadframe structure 110. The battery 700, shown in FIG. 7, typically has protruding contact tabs 720 which are brought into alignment with contact pads 730 on the leadframe strip 740. This leadframe strip 740 has additional connecting structures (730,735), in its patterns, for mechanically and electrically connecting the battery 700 to power input contacts 770 on the active chip 440A. A bonding head 750 is brought into place to make the bonds. The bonds may be accomplished by soldering, thermosonic, or laser-sonic bonding.

In one preferred embodiment, spot welding 770 is used to attach the battery 700 contact pads 720 to the connecting structures 730 by fusing the metals making up the contact pads 720 and connecting structures 730. By using spot welding, similar or dissimilar metals can be fused together. Spot welding is fast and localizes the heat to the fused area without overheating the chip 440A or battery 700. Spot welding 770 also is fluxless so that corrosive materials arc not introduced to the electrical contacts. Spot welding 770 produces a low impedance connection and provides good mechanical strength at the fused area so that structural support is given at the fused area.

Figure 8:
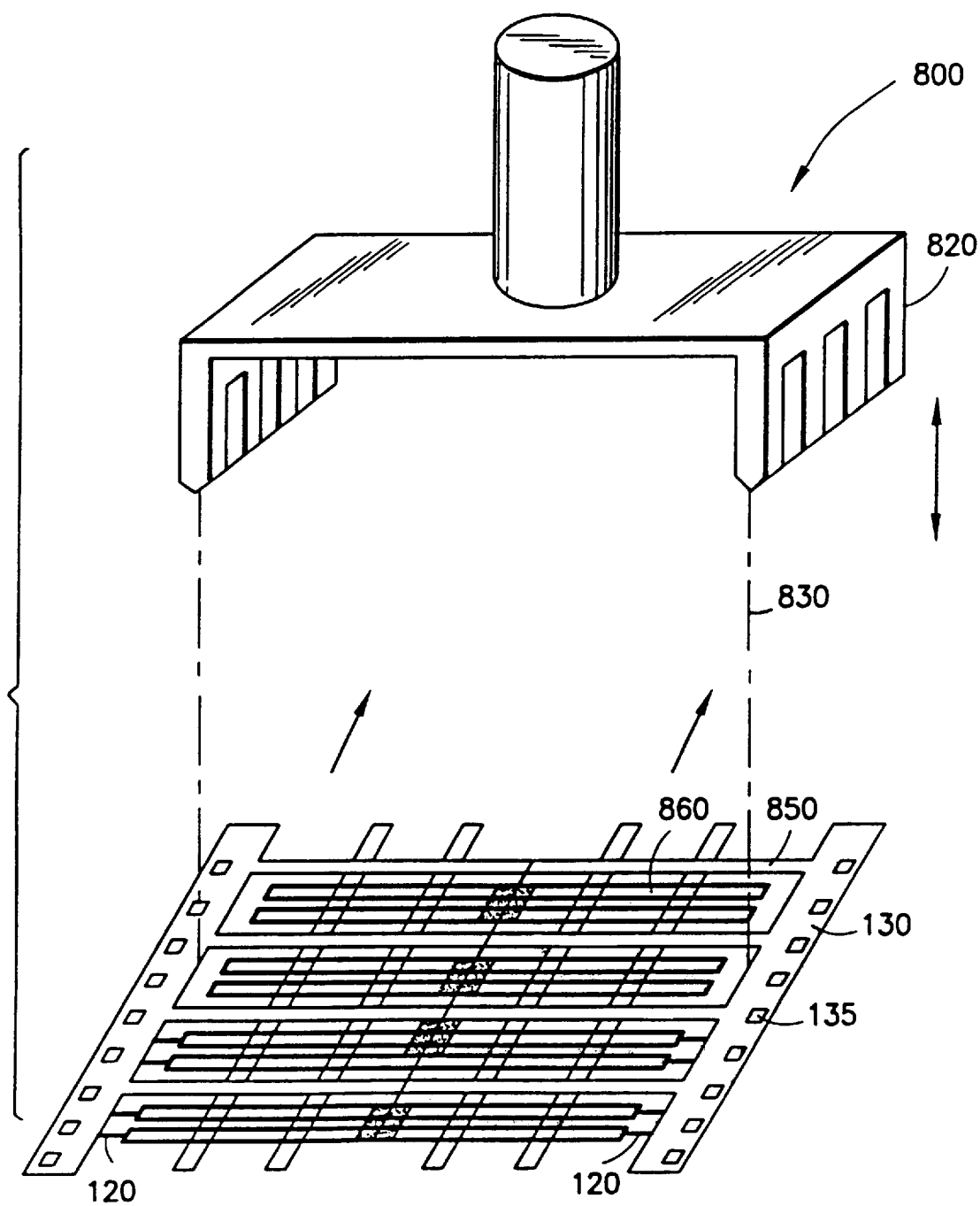
FIG. 8 is a drawing showing a method for the cutting of support bars holding individual thin antennas to the leadframe strip.

In step 800, each of the support bars 120 is severed 830 by a cutting tool 820 as shown in FIG. 8. During this severing 830, the antenna 110 is electrically and mechanical separated from the leadframe strip 100 and the supporting frame 130 by cutting the support bars 120. Alternatively, the cutting tool 820 can sever 830 the antenna 110 at any point (particularly for dipole antenna structures) to trim or establish a different resonant antenna length. Although the antenna 110 is mechanically separated from the leadframe strip 100, in a preferred embodiment, the leadframe antenna 110 is still mechanically supported by the positioner strips 240. This allows the antenna 110 to be further processed without being mechanically distorted. That is, the positioner strips 240 maintain the geometric integrity of the antenna. Note also that the support rails 850, part of the supporting frame 130, are not cut (severed) 830 in a preferred embodiment, so that the support frame 130 can still be used to transport the components 860 (leadframe antenna 110 and chip 440.)

In step 900, the package is sealed. In a preferred embodiment, FIG. 9, a strip 910 of components 860 is fed between two heated rollers 930. The strip 910 is the leadframe strip 100 with the chips attached, and in some embodiments, severed 800.

The strip 910 is transported by a transporter or hitch feeder (not shown) that moves 915 the strip 910. See U.S. Pat. No. 5,052,606, entitled "Tape Automated Bonding Feeder" Cipolla et al. issued] on Oct. 1, 1991 that is herein incorporated by reference in its entirety.

As strip 910 of components 860 moves through the rollers 930, sealing material 920 is also directed between the rollers 930. Pressure is exerted by the rollers 930 on the sandwich of materials. Heat is transferred from the heated rollers 930 to make the seal and create the lamination on one or both sides. Typically the materials are heated to 200 degrees C. Accordingly, where positioners 240 are used, the positioners 240 may reflow during this laminating process. Materials used as lamination materials include polyester/ethyl vinyl acetate PET/EVA, polypropylene sulfone PPS, or polyester PET. Other lamination materials include pa per, cardboard, polymers, polyethylene. The sealing (lamination) material can also have multiple layers, each layer being any of the materials above. Alternatively, the strip 910 can be transported through more than one lamination sealing process 900.

Figure 9:
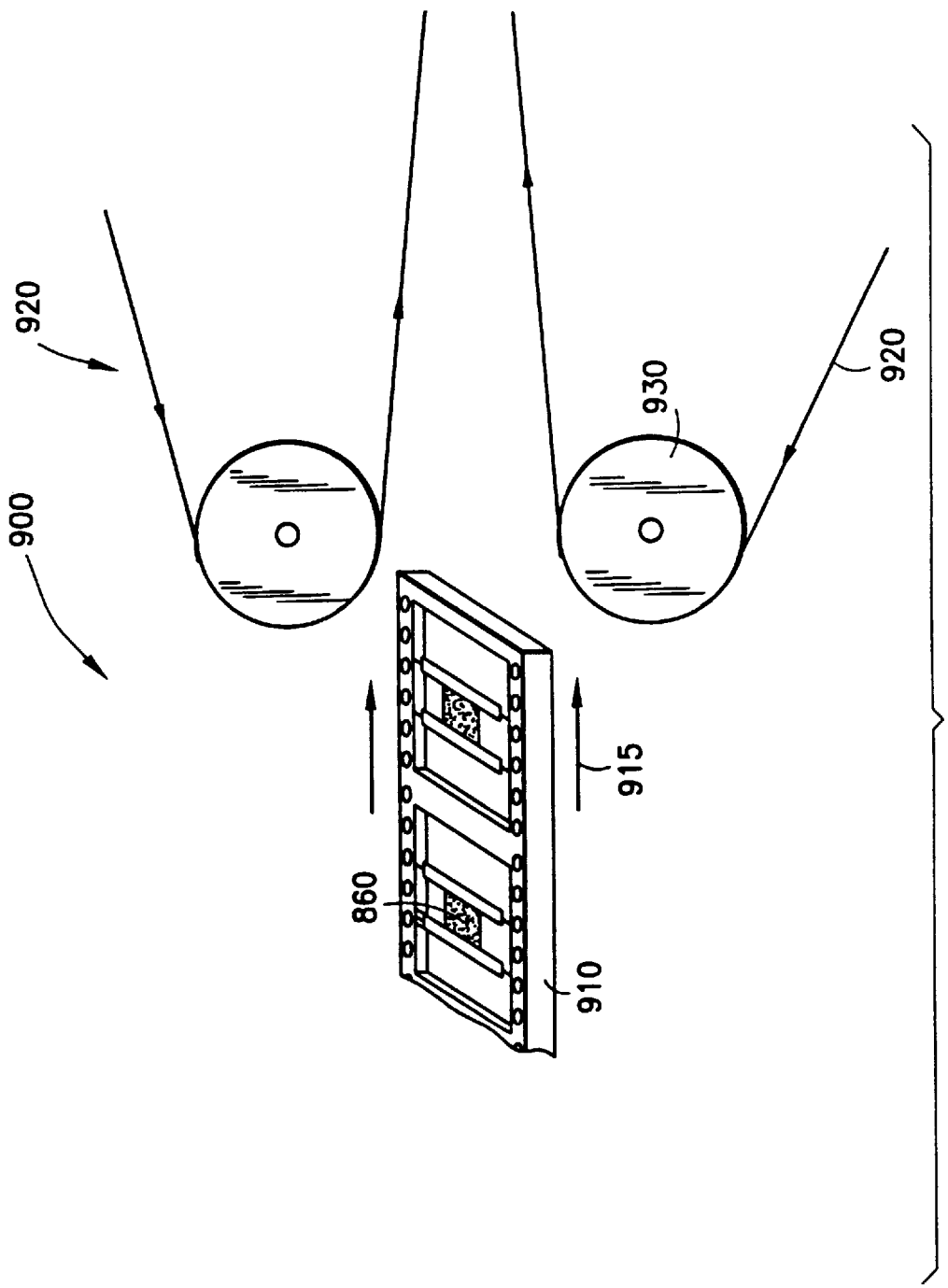
FIG. 9 is a drawing showing one preferred embodiment of a method for sealing (laminating) the strip of thin leadframe antennas with bon(ed(l chips.
Figure 10:
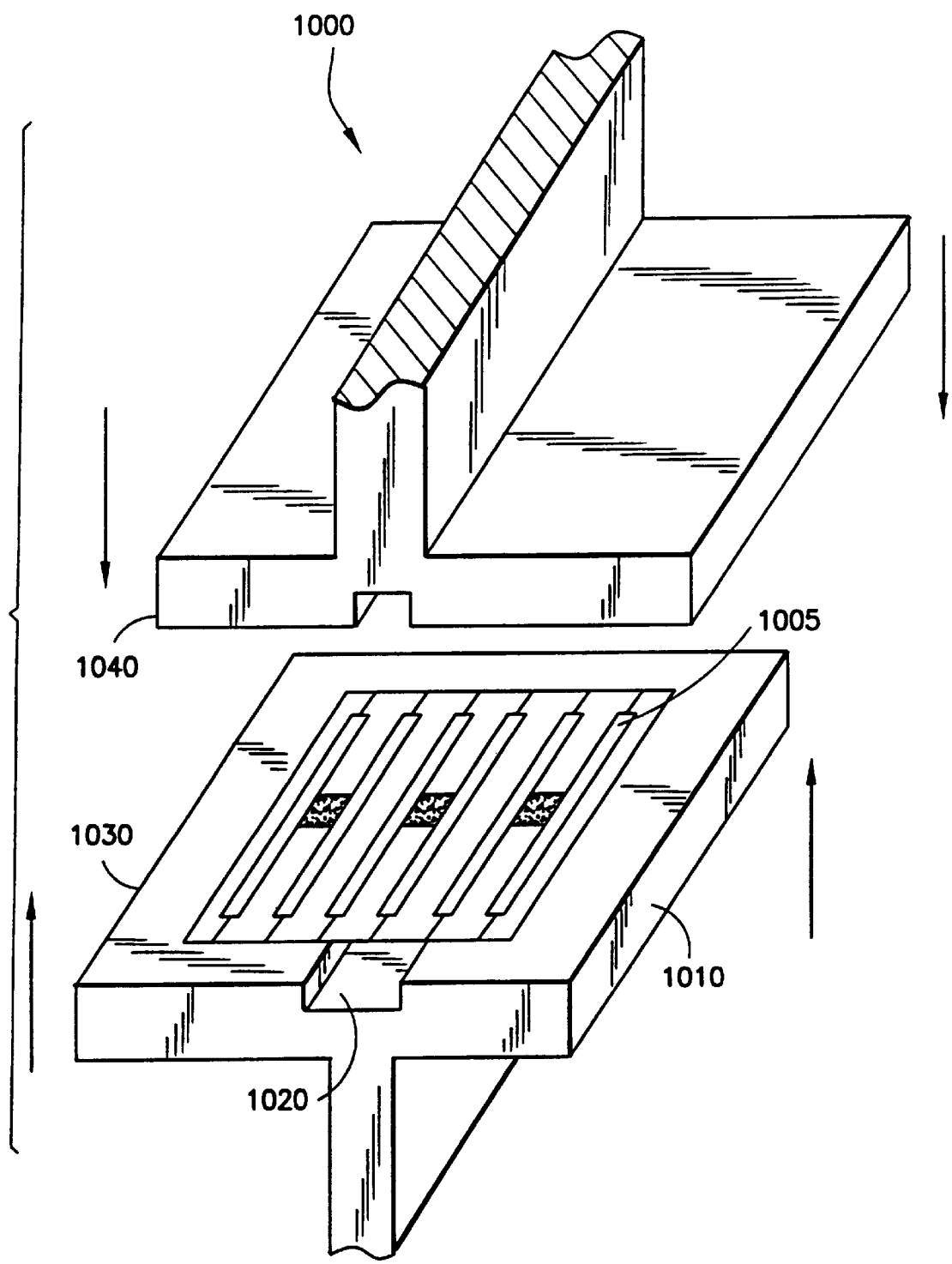
FIG. 10 is a drawing of an alternative method for the sealing (molding) the strip of thin leadframe antennas with bonded chips.

In an alternative embodiment, FIG. 10, the sealing of the packages 900 is accomplished by injection molding 1000 instead of the lamination in FIG. 9. A strip of components 1005 is placed in a mold 1010. The two halves of the mold 1030 and 1040 are brought together and molding material 1025 is introduced through a groove 1020.

Other molding techniques 1000 include reaction injection molding (RIM), compression molding, blow molding, or transfer molding. The molding 1000, can also be performed by dipping in a liquid sealing material such wax, or Dow-Corning silicone rubber, or Humiseal. These and other techniques for package sealing are described in the book, "Microelectronics Packaging Handbook", incorporated above.

In an alternative embodiment, the support bars 120 are not cut, i.e, process 800 is omitted before the lamination in process 900. In this embodiment, the positioners 240 can be attached or alternatively need not be attached. (See FIG. 3.) The leadframe antenna 110 on the component 860 is structurally supported by the lamination in process 900 and therefore does not need to have positioners 240. In a later stop (see FIG. 11 below), the component 860 is excised. In this embodiment, a small part or the leadframe antenna is exposed to the environment at the points where the antenna 110 is excised. However, the component 860 can be dipped after the excising 110 to completely seal the exposed ends. Dipping techniques are known.

In an another alternative embodiment, the support bars 120 are not cut, i.e. process 800 is omitted before the molding process 1000 (in lieu of the lamination 900.) In this embodiment, the positioners 240 can be attached or alternatively need not be attached. (See FIG. 3.) In this embodiment, the leadframe antenna 110 on the component 860 is structurally supported by the molding in process 1000. In a later step (see FIG. 11 below), the molded component 860 is excised 1100 from the lead frame strip. In this embodiment, the ends (either outside of the molded or at the cut edge of the mold) of the antenna 110 are exposed to the environment. To cover the antenna 110 totally, the molded component 860 can be picked up and dipped or laminated to totally cover the antenna 110.

In alternative embodiments of molding 1000, the mold can be large enough so that the circuit chip 440 and all parts of the leadframe antenna 110 are hermetically sealed by the mold. Where positioners 240 are used before the molding 1000, the positioners 240 can be made of a material that is compressed during the molding 1000. The molding 1000 can also cause the positioners 240 to reflow during the molding. Positioners 240 made of polyimide would compress but not reflow during molding 1000. Positioners 240 made of some thermoplastics also would compress but not reflow during molding 1000. Positioners 240 made of other thermoplastics can be made to compress and reflow during molding 1000.

Figure 11:
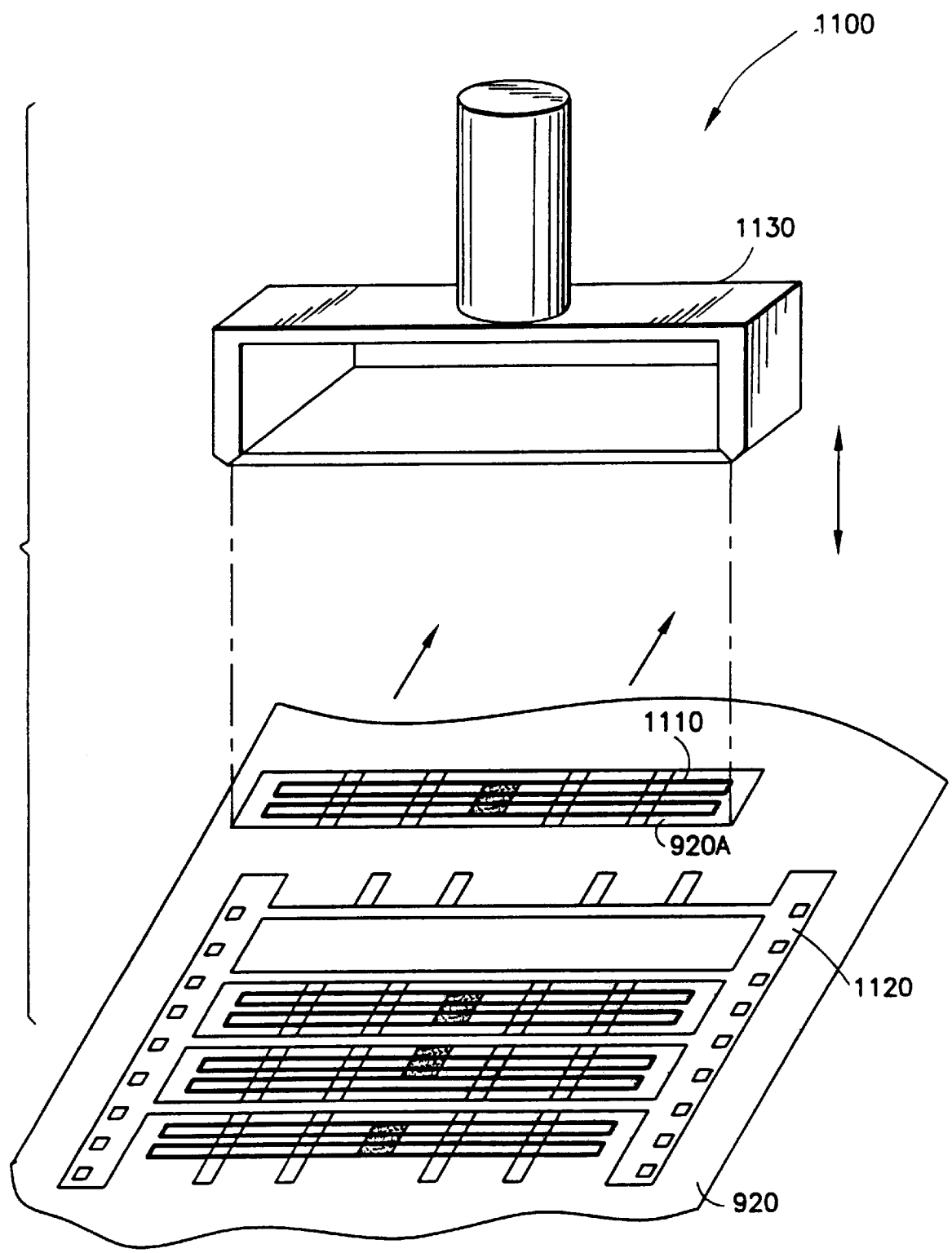
FIG. 11 is a drawing of a method for excising individual radio frequency tags from a laminated leadframe strip to produce a component transponder.

In step 1100, shown in FIG. 11, the completely sealed (laminated 920 and/or molded) component 1110 is cut or excised 1100 from the strip 1120 by means of a known cutting tool 1130. The cutting tool 1130 cuts the lamination 920 so that the sealed component 1110 is separated from the laminated leadframe strip 1120. The component 1110 is therefore covered by a protective surrounding 920A that is the part of the lamination 920 cut away by the cutting tool 1130. (See patent application "Thin Radio Frequency Transponder with Leadframe Antenna Structure" incorporated above.) This protective surrounding 920A seals all parts of the sealed component 1110 from the environment.

Given this disclosure, alternative equivalent embodiments would become apparent to one skilled in the art. These embodiments are within the contemplation of the inventors.

We claim:

1. A method of making a Radio Frequency (RF) tag, comprising the steps of:

forming a leadframe in which one or more conductors in the leadframe form an operative antenna;

joining a circuit chip directly to the leadframe by electrically connecting one or more connectors on the circuit chip directly to the operative antenna formed in the leadframe without any further antenna being connected to the circuit chip or to the operative antenna formed in the leadframe;

covering the circuit chip and operative antenna formed in the leadframe; and cutting out the circuit chip along with the connected operative antenna formed in the leadframe.

2. A method, as in claim 1, where the covering is done by sealing the circuit chip and the operative antenna formed in the leadframe between two organic laminations.

3. A method, as in claim 2, where the organic laminations include any of the following: paper, cardboard, polymers, polyethylene, polyester, polyester/ethyl vinyl acetate, or polypropylene sulfone.

4. A method, as in claim 2, further comprising the step of: encapsulating the circuit chip with an encapsulant before the sealing with organic laminations.

5. A method, as in claim 1, where the covering is done by molding.

6. A method, as in claim 5, where the molding includes any of: transfer molding, injection molding, reaction injection molding, compression molding, blow molding, and dipping.

7. A method, as in claim 5, where the circuit chip and the operative antenna formed in the leadframe are also laminated.

8. A method, as in claim 1, where the operative antenna formed in the leadframe is supported by one or more positioners.

9. A method, as in claim 8, where the positioners are one or more strips.

10. A method, as in claim 8, where the positioner is a sheet with an aperture in the location where the circuit chip is attached.

11. A method, as in claim 1, where the operative antenna formed in the leadframe is electrically connected to the one or more connectors by one of thermal compression bonding, ultra sonic bonding, laser sonic bonding, conducting adhesive, wire bonding, and laser sonic bonding.

12. A method of making a Radio Frequency (RF) tag, comprising the steps of:

forming a leadframe in which one or more conductors in the leadframe form an operative antenna and the operative antenna formed in the leadframe has one or more support bars mechanically connecting the operative antenna formed in the leadframe to the leadframe;

joining a circuit chip directly to the leadframe by electrically connecting one or more connectors on the circuit chip directly to the operative antenna formed in the leadframe without any further antenna being connected to the circuit chip or to the operative antenna formed in the leadframe;

covering the circuit chip and operative antenna formed in the leadframe; and cutting the support bars to disconnect the circuit chip and the connected operative antenna formed in the leadframe.

13. A method of making an RF tag, as in claim 12, further comprising the step of:

supporting the operative antenna formed in the leadframe by attaching one or more positioners prior to the joining step.

14. A method, as in claim 13, where the positioners are one or more strips.

15. A method, as in claim 13, where the positioner is a sheet with aperture in the location where the circuit chip is attached.

16. A method, as in claim 13, where the covering is done by molding so that the circuit chip and all parts of the operative antenna formed in the leadframe are hermetically sealed by the mold.

17. A method, as in claim 16, where the molding is one of transfer molding, injection molding, reaction injection molding, compression molding, blow molding, and dipping.

18. A method, as in claim 16, where the positioners arc compressed during the molding.

19. A method, as in claim 16, where the positioners reflow during the molding.

20. A method, as in claim 13, further comprising the step of:

encapsulating the circuit chip and connections between the circuit chip and the operative antenna formed in the leadframe after the joining step.

21. A method, as in claim 20, where the covering is done by laminating on two sides so that the circuit chip and all parts of the operative antenna formed in the leadframe are hermetically sealed by the laminating.

22. A method, as in claim 21, where the positioners reflow during the laminating.

23. A method, as in claim 13, further comprising the steps of:

after the joining step, placing an overlayer over connections between the connectors on the circuit chip and the operative antenna formed in the leadframe; and encapsulating the circuit chip and the connections between the connectors on the circuit chip and the operative antenna formed in the leadframe by dispensing an encapsulate between the circuit chip and the overlayer.

24. A method, as in claim 23, where the covering is done by laminating on two sides so that the circuit chip and all parts of the operative antenna formed in the leadframe are hermetically sealed by the laminating.

25. A method of making a Radio Frequency (RF) tag, comprising the steps of:

forming a leadframe in which one or more conductors in the leadframe form an operative antenna;

joining a circuit chip directly to the leadframe by electrically connecting one or more connector on the circuit chip directly to the operative antenna formed in the leadframe without any further antenna being connected to the circuit chip or to the operative antenna formed in the leadframe;

attaching an overlayer to and over the operative antenna formed in the leadframe, the overlayer covering a surface of the circuit chip and the connectors; and dispensing an encapsulation material between the overlayer and the surface of the circuit chip.

26. A method of making a Radio Frequency (RF) tag, comprising the steps of:

forming a leadframe in which one or more conductors in the leadframe form an operative antenna;

joining a circuit chip to the operative antenna formed in the leadframe by electrically connecting one or more connectors on the circuit chip to the operative antenna formed in the leadframe;

joining a battery to the leadframe by electrically connecting one or more battery connectors on the battery to corresponding connectors on the leadframe, the battery being for powering the circuit chip;

covering the circuit chip, battery, and operative antenna formed in the leadframe; and cutting out the circuit chip along with the connected battery and operative antenna formed in the leadframe.

27. A method, as in claim 26, where the battery is electrically connected to the battery connectors by any one of the following: soldering, thermosonic bonding, laser-sonic bonding, and spot welding.

* * * * *